United States Patent
Zelder et al.

(10) Patent No.: US 8,963,570 B2
(45) Date of Patent: Feb. 24, 2015

(54) CONTACTLESS LOOP PROBE

(75) Inventors: Thomas Zelder, Lüneburg (DE); Bernd Geck, Hannover (DE)

(73) Assignee: Rosenberger Hochfrequenztechnik GmbH & Co. KG, Fridolfing (DE)

( * ) Notice: Subject to any disclaimer, the term of this patent is extended or adjusted under 35 U.S.C. 154(b) by 450 days.

(21) Appl. No.: 13/057,900

(22) PCT Filed: Jul. 15, 2009

(86) PCT No.: PCT/EP2009/005144
§ 371 (c)(1),
(2), (4) Date: Mar. 8, 2011

(87) PCT Pub. No.: WO2010/015315
PCT Pub. Date: Feb. 11, 2010

(65) Prior Publication Data
US 2011/0267088 A1     Nov. 3, 2011

(30) Foreign Application Priority Data
Aug. 7, 2008   (DE) ............... 20 2008 010 533 U

(51) Int. Cl.
*G01R 1/067*   (2006.01)
*G01R 1/07*    (2006.01)
*G01R 31/315*  (2006.01)

(52) U.S. Cl.
CPC ............. *G01R 1/07* (2013.01); *G01R 1/06772* (2013.01); *G01R 31/315* (2013.01)
USPC ......... 324/755.02; 324/95; 324/126; 324/632

(58) Field of Classification Search
USPC ................. 324/362, 126, 95, 149, 755.02
See application file for complete search history.

(56) References Cited

U.S. PATENT DOCUMENTS

| 4,829,242 A | * | 5/1989 | Carey et al. | ............ | 324/754.13 |
| 4,849,689 A |   | 7/1989 | Gleason |   |   |
| 4,894,612 A | * | 1/1990 | Drake et al. | ............ | 324/755.07 |

(Continued)

FOREIGN PATENT DOCUMENTS

| DE | 69216743 T2 | 5/1997 |
| DE | 20 2007 010784 U1 | 10/2007 |
| EP | 1316806 A | 6/2003 |

OTHER PUBLICATIONS

Yhland K. et al.; Noncontacting Measurement of Power in Microstrip Circuits; ARFTG Conference, 2006 67th, IEEE, Jun. 16, 2006, pp. 201-205, XP031384116.

(Continued)

*Primary Examiner* — Huy Q Phan
*Assistant Examiner* — Dustin Dickinson
(74) *Attorney, Agent, or Firm* — DeLio, Peterson & Curcio, LLC; Robert Curcio

(57) ABSTRACT

The invention relates to a contactless loop probe for the contactless decoupling of an HF signal for a contactless measuring system, comprising at least one coupling structure (10) and at least one first signal conductor (12) electrically connected to the coupling structure (10) by a first transition (20), said signal conductor being electrically connected by a second transition (22) to an output (14) for electrically connecting to the measuring system, wherein the coupling structure (10) is designed as an HF waveguide comprising at least one signal conductor (24; 30) and at least one reference conductor (26; 32).

14 Claims, 2 Drawing Sheets

(56) References Cited

U.S. PATENT DOCUMENTS

| | | | |
|---|---|---|---|
| 5,539,323 A * | 7/1996 | Davis, Jr. | 324/690 |
| 5,867,020 A | 2/1999 | Moore | |
| 7,042,236 B1 * | 5/2006 | Wollitzer | 324/755.02 |
| 7,091,915 B1 * | 8/2006 | Truthan et al. | 343/715 |
| 7,292,112 B2 * | 11/2007 | Oxborrow | 331/96 |
| 7,463,110 B2 * | 12/2008 | Lapierre et al. | 333/26 |
| 7,482,814 B2 * | 1/2009 | Schill et al. | 324/457 |
| 2002/0129323 A1 * | 9/2002 | Kasukabe et al. | 716/4 |
| 2006/0066304 A1 | 3/2006 | Schill, Jr. et al. | |
| 2007/0069741 A1 * | 3/2007 | Kleismit et al. | 324/638 |
| 2011/0260743 A1 * | 10/2011 | Zelder | 324/754.03 |

OTHER PUBLICATIONS

Anonymous: "Easy, Ultra-Precise Submicron Probing", [Online] URL:http//www.cmicro.com/download.cfm?downloadfile=CFA9D881-5056-B03B-BA1232577B319315>, whole document, Jan. 26, 2001, pp. 1-2, XP002550524.

Sugawara K. et al.: "Noncontacting Electric and Magnetic Field Probe for Measuring EM Fields on Microwave Planar Circuits"; Microwave Conference 2007, APMC 2007, Asia-Pacific, IEEE, Piscataway, NJ, USA, Dec. 11, 2007, pp. 1-4; XP031280360.

* cited by examiner

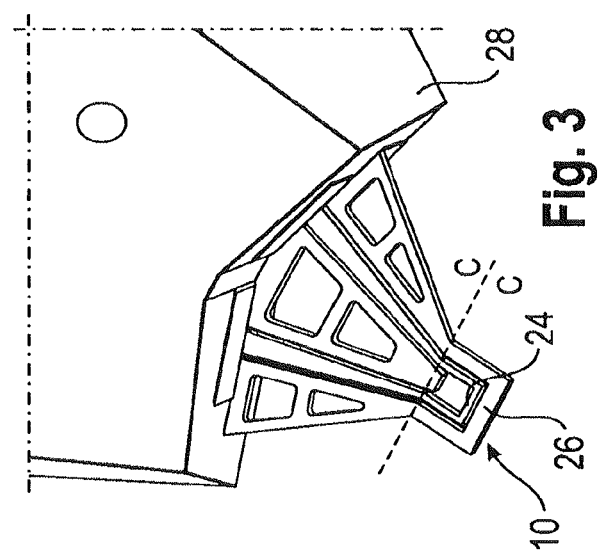
Fig. 1
Fig. 2
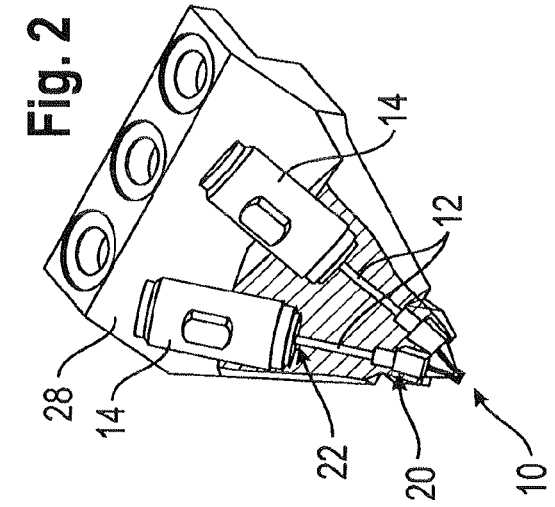
Fig. 3
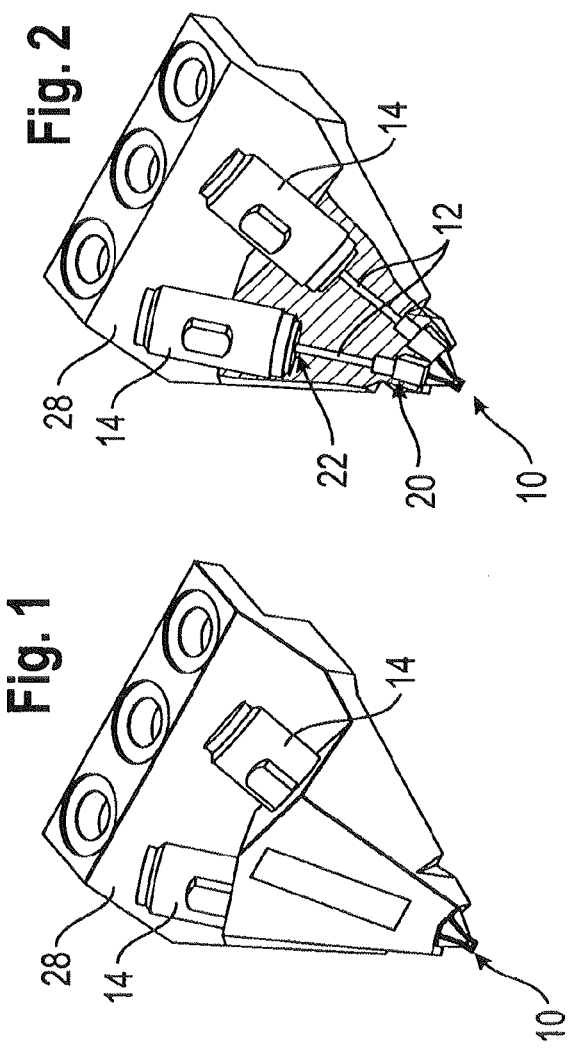
Fig. 4
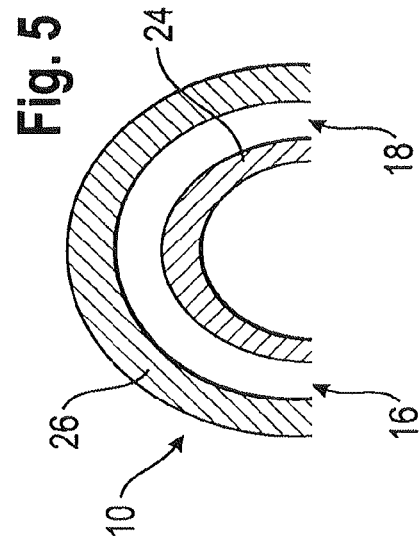
Fig. 5
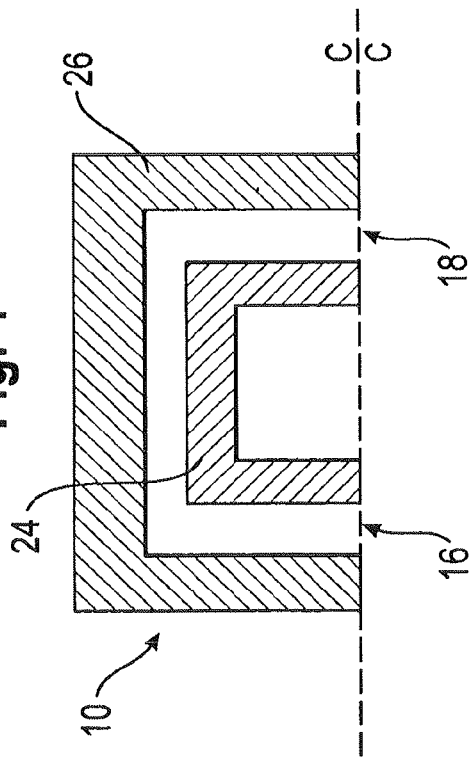

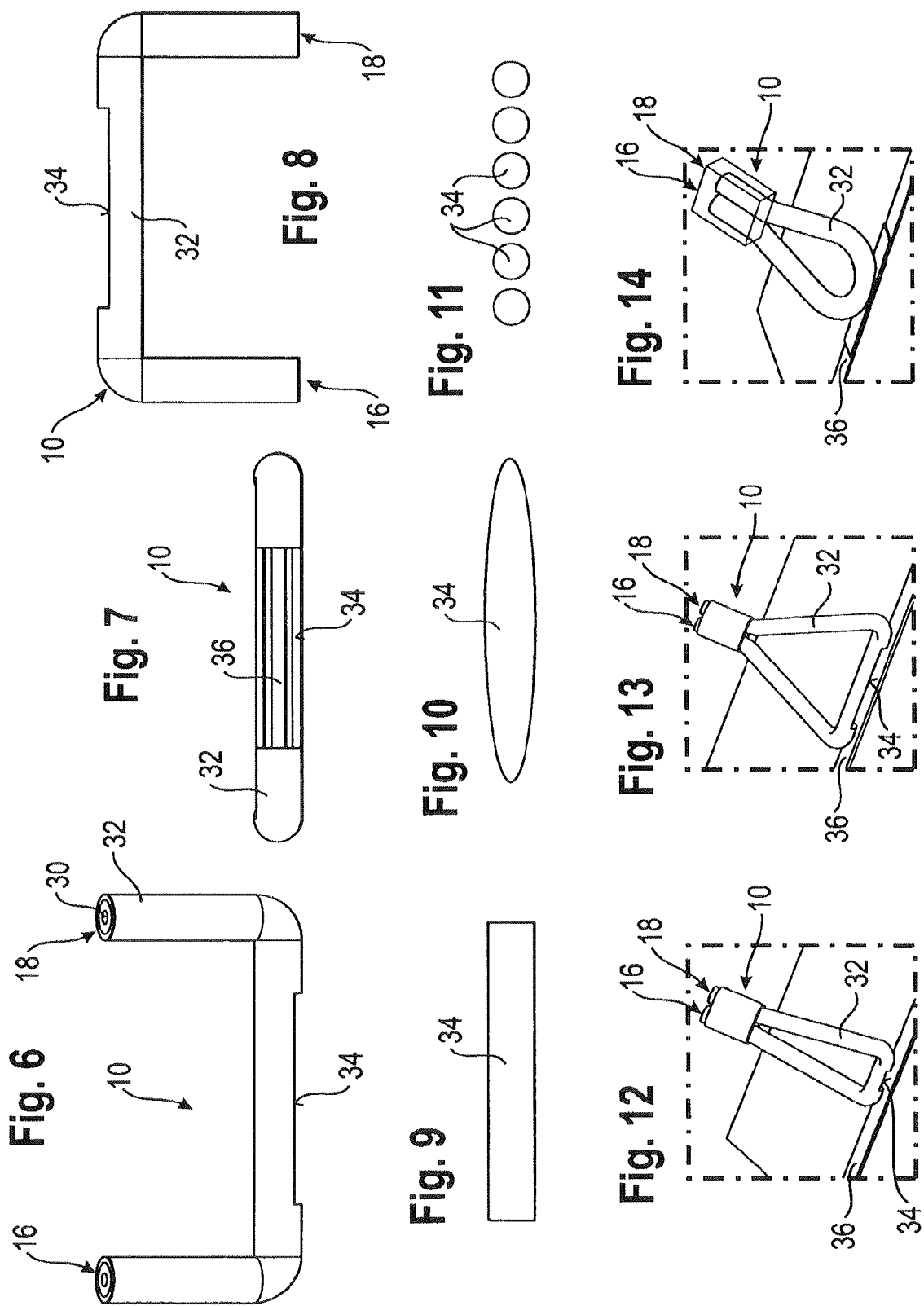

CONTACTLESS LOOP PROBE

This application is a National Stage filing based on PCT/PCT/EP2009/005144, filed Jul. 15, 2009, and which claims priority to German Patent Application No. DE 20 2008 010 533.1 filed Aug. 7, 1008.

BACKGROUND OF THE INVENTION

1. Field of the Invention

The present invention relates to a contactless loop probe for the contactless coupling-out of an RF signal for a contactless measuring system, having at least one coupling structure and at least one first signal conductor or guide which is electrically connected to the coupling structure by a first transition and which is electrically connected by a second transition to an output for electrical connection to the measuring system.

2. Description of Related Art

The use of contactless loop measuring probes for detecting interfering emissions is known, particularly in the field of electromagnetic compatibility (EMC), from for example H. Whiteside, R. W. P. King "The loop antenna as a probe," IEEE Transactions on Antennas and Propagation, Vol. 12, No. 3, pp. 291-297, May 1964, or M. Kanda, "An electromagnetic near-field sensor for simultaneous electric and magnetic-field measurements," IEEE Transactions on Electromagnetic Compatibility, Vol. 26, No. 3, pp. 102-110, August 1984, or M. E. G. Upton, A. C. Marvin, "Improvements to an electromagnetic near-field sensor for simultaneous electric and magnetic field measurements," IEEE Transactions on Electromagnetic Compatibility, Vol. 35, No. 1, pp. 96-98, February 1993.

It is also known for loop probes to be used in the production of directional couplers from, for example, K. W. Wagner "Induktionswirkung von Wanderwellen in Nachbarleitungen" [Inductive effect of travelling waves on neighboring lines], Elektronische Zeitschrift, Vol. 35, pp. 639-643, 677-680, 705-708, 1914; P. P. Lombardini, R. F. Schwartz, P. J. Kelly, "Criteria for the design of loop-type directional couplers for the L band," IEEE Transactions on Microwave Theory and Techniques, Vol. 4, No. 4, pp. 234-239, October 1956; B. Maher, "An L-band loop-type coupler," IEEE Transactions on Microwave Theory and Techniques, Vol. 9, No. 4, pp. 362-363, July 1961; F. De Groote, J. Verspecht, C. Tsironis, D. Barataud and J.-P. Teyssier, "An improved coupling method for time domain load-pull measurements," European Microwave Conference, Vol. 1, p. 4 et seq. October 2005 or K. Yhland, J. Stenarson, "Noncontacting measurement of power in microstrip circuits," in 65th ARFTG, pp. 201-205, June 2006. A directional coupler is a four-port device which generally comprises two lines which are coupled to one another. The job of the directional coupler is to separate the forward and backward waves on a line.

Rather than loop probes, what are also used in EMC technology and for characterizing electrical components are purely inductive or capacitive probes, as is known for example from T. Zelder, H. Eul, "Contactless network analysis with improved dynamic range using diversity calibration," Proceedings of the 36th European Microwave Conference, Manchester, UK, pp. 478-481, September 2006; T. Zelder, H. Rabe, H. Eul, "Contactless electromagnetic measuring system using conventional calibration algorithms to determine scattering parameters," Advances in Radio Sciences—Kleinheubacher Berichte 2006, Vol. 5, 2007; T. Zelder, I. Rolfes, H. Eul, "Contactless vector network analysis using diversity calibration with capacitive and inductive coupled sources," Advances in Radio Science—Kleinheubacher Berichte, Vol. 5, 2007, or J. Stenarson, K. Yhland, C. Wingqvist, "An in-circuit noncontacting measurement method for S-parameters and power in planar circuits," IEEE Transactions on Microwave Theory and Techniques, Vol. 49, No. 12, pp. 2567-2572, December 2001.

A possible coupling structure for separating forward and backward waves is the loop-type directional coupler, which was described by P. P. Lombardini, R. F. Schwartz, P. J. Kelly in "Criteria for the design of loop-type directional couplers for the L band," IEEE Transactions on Microwave Theory and Techniques, Vol. 4, No. 4, pp. 234-239, October 1956 and by B. Maher in "An L-band loop-type coupler," IEEE Transactions on Microwave Theory and Techniques, Vol. 9, No. 4, pp. 362-363, July 1961. A loop-type directional coupler comprises a loop of conductor or guide which is positioned above or in a waveguide. Waveguides of any desired kinds may be used in this case such as hollow waveguides, planar strip lines, or co-axial lines. There are a variety of uses for a loop-type directional coupler. F. De Groote, et al. (op. cit) for example used a loop-type directional coupler as a component of a contactless measuring system in 2005 and Yhland, et al. (op. cit.) used one as a component of a contactless measuring system in 2006.

Scattering parameters of electrical components embedded in a complex circuit can be determined by contactless vector network analysis. This is described in for example T. Zelder, B. Geck, M. Wollitzer, I. Rolfes and H. Eul, "Contactless network analysis system for the calibrated measurement of the scattering parameters of planar two-port devices," Proceedings of the 37th European Microwave Conference, Munich, Germany, pp. 246-249, October 2007. Compared with conventional methods of network analysis where contacts are used, the internal directional couplers of a network analyzer are replaced by contactless near-field measuring probes which are connected directly to the vectorial points of measurement of the analyzer.

BRIEF SUMMARY OF THE INVENTION

The object underlying the invention is to improve a contactless loop probe of the above kind in respect of its electrical properties.

This object is achieved in accordance with the invention by a contactless loop probe of the above kind which is directed to in a first aspect, a contactless loop probe for the contactless coupling-out of an RF signal for a contactless measuring system, comprising at least one coupling structure and at least one first signal conductor or guide which is electrically connected to the coupling structure by a first transition and which is electrically connected by a second transition to an output for electrical connection to the measuring system, the coupling structure forming an RF waveguide having at least one signal conductor or guide and at least one reference conductor or guide, wherein the coupling structure includes a planar strip line or a coplanar line, with the signal conductor or guide forming a first planar conductor and the reference conductor or guide forming a second planar conductor, the loop probe having a housing and all the above-mentioned parts being arranged on or in the housing of the loop probe.

The contactless loop probe includes having the coupling structure, the first transition, the first signal conductor or guide, the second transition, and the output impedance-controlled such that impedances are matched to one another resulting in a high input return loss and a high directional effect are obtained.

The at least one first signal conductor or guide may form an RF signal line, an RF signal line for a co-axial line, a planar strip line, a coplanar line, or a hollow waveguide.

Either the first or second transition, or both, may form a planar transition, a co-axial transition, a coplanar transition, a hollow waveguide transition, a planar-co-axial transition, a planar-hollow waveguide transition, a co-axial-hollow waveguide transition, a coplanar-co-axial transition, a coplanar-hollow waveguide transition, or a planar-coplanar transition.

The coupling structure may include two ends, one end being electrically connected to the first signal conductor or guide and the other end being electrically connected to a terminating resistor or impedance, or each end may be electrically connected to a first signal conductor or guide.

The contactless loop probe may further include at least one output forming an RF signal line, an RF signal line for a co-axial line, a planar strip line, a coplanar line or a hollow waveguide.

When the contactless loop probe includes two or more coupling structures, every two coupling structures may be electrically connected together by a second signal line and respective first transitions.

The contactless loop probe may further include at least one second signal line forming an RF signal line, an RF signal line of a co-axial line, a planar strip line, a coplanar line, or a hollow waveguide.

In addition, the contactless loop probe may include a device for determining the distance at which the coupling structure is situated from a conductor or guide emitting a near field, which may comprise an optical, electrical, mechanical, or electromechanical distance sensor, or any combination thereof, as well as a device for determining the position of the loop probe in space, such as an image sensor. The contactless loop probe may also include a measurement amplifier for amplifying the coupled-out signals.

The housing may include a sheath of ferrite material or an absorbent material.

The first transition, the second transition, or both, may form a soldered, brazed, welded or adhesive-bonded electrical connection.

The probe may include a positioning arrangement for positioning it in space, such as a stepping motor.

Advantageous embodiments of the invention are described in the other claims.

The invention will be explained in detail in what follows by reference to the drawings. In the drawings:

FIG. 1 is a perspective view of a preferred embodiment of contactless loop probe according to the invention.

FIG. 2 is a partly cut-away view of the contactless loop probe shown in FIG. 1.

FIG. 3 is an enlarged view of a coupling structure of the contactless loop probe shown in FIG. 1.

FIG. 4 is a schematic view of a first preferred embodiment of coupling structure in the form of a planar line.

FIG. 5 is a schematic view of a second preferred embodiment of coupling structure in the form of a planar line.

FIG. 6 is a view from the side of a third preferred embodiment of coupling structure, in the form of a co-axial line.

FIG. 7 is a plan view of the third preferred embodiment of coupling structure shown in FIG. 6.

FIG. 8 is a further view from the side of the third preferred embodiment of coupling structure shown in FIG. 6.

FIG. 9 shows a first preferred embodiment of opening which is formed in an outer conductor of the coupling structure shown in FIG. 6.

FIG. 10 shows a second preferred embodiment of opening which is formed in an outer conductor of the coupling structure shown in FIG. 6.

FIG. 11 shows a third preferred embodiment of opening which is formed in an outer conductor of the coupling structure shown in FIG. 6.

FIG. 12 is a perspective view of a fourth preferred embodiment of coupling structure, in the form of a co-axial line.

FIG. 13 is a perspective view of a fifth preferred embodiment of coupling structure, in the form of a co-axial line.

FIG. 14 is a perspective view of a sixth preferred embodiment of coupling structure, in the form of a co-axial line.

DETAILED DESCRIPTION OF THE INVENTION

To determine the scattering parameters of a device under test (DUT) with a contactless, generally vectorial, measuring system, use is made of inductive and/or capacitive coupling structures. The measuring probes are positioned in the electromagnetic near field above the signal lines of the device under test. What are determined by means of these coupling structures are either the current and/or the voltage in a signal line which is connected directly to the device under test. Alternatively, what are also measured are the forward and backward waves on the signal line, in which case directional couplers, and in particular loop-type couplers, are then used as coupling structures to separate the two waves from one another. To measure the scattering parameters, conventional methods of calibration, such as TRL for example (G. F. Engen and C. A. Hoer "Thru-reflect-line: An improved technique for calibrating the dual six-port automatic network analyzer," IEEE Transactions on Microwave Theory and Techniques, Vol. 12, pp. 987-993, December 1979), are used in the same way as in contacting network analysis.

In contactless vector network analysis, at least one measuring probe, such for example as a loop of conductor or guide or two capacitive probes, is required for each port of an unknown device under test (DUT) at which measurements are to be made. What are used for example are contactless loops of conductor which are produced from co-axial semi-rigid lines (see F. De Groote, J. Verspecht, C. Tsironis, D. Barataud and J.-P. Teyssier, "An improved coupling method for time domain load-pull measurements," European Microwave Conference, Vol. 1, p. 4 et seq., October 2005 and K. Yhland, J. Stenarson, "Noncontacting measurement of power in microstrip circuits," in 65th ARFTG, pp. 201-205, June 2006. What are used as alternatives in the contactless measuring systems are solely capacitive probes (see T. Zelder, H. Eul, "Contactless network analysis with improved dynamic range using diversity calibration," Proceedings of the 36th European Microwave Conference, Manchester, UK, pp. 478-481, September 2006 and T. Zelder, H. Rabe, H. Eul, "Contactless electromagnetic measuring system using conventional calibration algorithms to determine scattering parameters," Advances in Radio Science—Kleinheubacher Berichte 2006, Vol. 5, 2007. The measuring systems in T. Zelder, I. Rolfes, H. Eul, "Contactless vector network analysis using diversity calibration with capacitive and inductive coupled probes," Advances in Radio Science—Kleinheubacher Berichte 2006, Vol. 5, 2007, and J. Stenarson, K. Yhland, C. Wingqvist, "An in-circuit noncontacting measurement method for S-parameters and power in planar circuits", IEEE Transactions on Microwave Theory and Techniques, Vol. 49, No. 12, pp. 2567-2572, December 2001 were produced with a combination of capacitive and inductive probes. The special feature of the probes in T. Zelder et al. (op. cit) is that they are produced on the same substrate together with the signal line.

Although contactless vector network analysis has the potential to enable components to be characterized contactlessly, no contactless measurements of scattering parameters have yet been made on RF or microwave components embedded in a circuit. To date, the positions of the contactless probes have not been varied during or after the calibration, but this is necessary if measurements are to be made within a circuit. By employing pseudo-contactless measurement, unknown, embedded two-port devices were characterized in T. Zelder, B. Geck, M. Wollitzer, I. Rolfes and H. Eul, "Contactless network analysis system for the calibrated measurement of the scattering parameters of planar two-port devices," Proceedings of the 37th European Microwave Conference, Munich, Germany, pp. 246-249, October 2007. What pseudo-contactless measurement means in this case is that printed coupling structures were used rather than totally contactless probes.

In a contactless loop probe of the above kind, provision is made in accordance with the invention for the coupling structure to take the form of an RF waveguide having at least one signal conductor or guide and at least one reference conductor or guide.

This has the advantage that a contactless loop probe becomes available which has a controlled impedance, thus allowing high directional attenuation to be obtained and fewer sheath waves to be produced, the contactless loop probe according to the invention being able to be defined more satisfactorily for analytical purposes, and the cut-off frequency being higher, than in the case of non-impedance-controlled measuring probes. As a result of the combination of signal conductor or guide and reference conductor or guide, controlled, and in particular impedance-controlled, propagation of radio frequency electromagnetic waves takes place in the region of the coupling structure.

The coupling structure, the first transition, the first signal conductor or guide, the second transition and the output are usefully designed to be impedance-controlled in such a way that they have impedances which are so matched to one another that a high input return loss and a high directional effect are obtained.

In a preferred embodiment, the coupling structure takes the form of a planar strip line or a coplanar line, with the signal conductor or guide taking the form of a first planar conductor and the reference conductor or guide taking the form of a second planar conductor.

In an alternative embodiment, the coupling structure takes the form of a co-axial line having a signal conductor or guide in the form of a center conductor and a reference conductor or guide in the form of an outer conductor, the outer conductor having at least one opening through which the center conductor is exposed. The at least one opening comprises at least one rectangular opening, at least one oval opening and/or at least one circular opening. The at least one opening is so formed in this case that the coupling structure has at all points, when seen in cross-section, an outer conductor around at least part of its circumference. Coupling of the coupling structure to an external field is achieved in this manner. The at least one opening comprises for example at least one rectangular opening, at least one oval opening and/or at least one circular opening.

In a further alternative embodiment, the coupling structure takes the form of a hollow In a further alternative embodiment, the coupling structure takes the form of a hollow waveguide having a reference conductor or guide in the form of an outer guide and a signal conductor or guide in the form of a cavity within the outer guide, the outer guide having at least one opening through which the cavity is exposed.

The at least one first signal conductor or guide usefully takes the form of an RF signal line and in particular that of a co-axial line, a planar strip line, a coplanar line or a hollow waveguide.

Depending on the nature of the coupling structure and of the two at least two signal conductors or guides, the first and/or second transitions or transition each take/takes the form of a planar transition, a co-axial transition, a coplanar transition, a hollow waveguide transition, a planar-co-axial transition, a planar-hollow waveguide transition, a co-axial-hollow waveguide transition, a coplanar-co-axial transition, a coplanar-hollow waveguide transition or a planar-coplanar transition.

In a preferred embodiment the coupling structure has two ends, one end being electrically connected to the first signal conductor or guide and the other end being electrically connected to a terminating resistor.

In an alternative embodiment, the coupling structure has two ends, each end being electrically connected to a signal conductor or guide.

Usefully, at least one output takes the form of an RF signal line, and in particular that of a co-axial line, a planar strip line, a coplanar line or a hollow waveguide.

In a preferred embodiment, two or more coupling structures are provided, every two coupling structures being electrically connected together by a second signal line and respective first transitions.

At least one second signal line usefully takes the form of an RF signal line, and in particular that of a co-axial line, a planar strip line, a coplanar line or a hollow waveguide.

To enable the loop probe to be arranged close to a conductor which emits an electromagnetic near field, at a controlled distance therefrom, there is provided in addition a device for determining the distance at which the coupling structure is situated from a conductor or guide emitting a near field.

The device for determining the distance comprises for example an optical, electrical, mechanical and/or electromechanical distance sensor.

To allow the loop probe to be arranged, under control, in three dimensions close to a conductor or guide which emits an electromagnetic near field, there is provided in addition a device for determining the position of the loop probe in space.

The device for determining the position of the loop probe in space is for example an image sensor.

The loop probe has for example a housing which, to avoid sheath waves is preferably sheathed in a ferrite material or an absorbent material. As an option, there may be formed in addition on the housing a mounting for fastening it to the measuring system. The housing is preferably made of metal, plastics material or an absorbent material.

In a preferred embodiment, the first and/or second transition takes the form of a soldered, brazed, welded or adhesive-bonded electrical connection.

To improve the dynamic measurement characteristics, the loop probe has in addition a measurement amplifier for amplifying the coupled-out signals.

In a preferred embodiment, the loop probe has in addition a positioning arrangement for positioning it in space, thus making the loop probe displaceable in at least one direction in space. The positioning arrangement has for example at least one positioning motor, and in particular a stepping motor.

The preferred embodiment of contactless loop probe according to the invention which is shown by way of example in FIGS. 1 to 3, for the contactless coupling-out of an RF signal from a signal conductor or guide (not shown) for a contactless measuring system, comprises a coupling structure 10, two first signal conductors or guides 12 which are each connected to one end of the coupling structure 10, and two outputs 14 which are connected to respective ones of the first signal conductors or guides 12. The two ends of the coupling structure 10 will be referred to in what follows as the "first port 16" (FIGS. 4, 5) and "second port 18" (FIGS. 4, 5). The electrical connection between the ports 16, 18 and the first signal conductors or guide 12 is made by respective first transitions 20 and the electrical connection between the first signal conductors or guides 12 and the outputs 14 is made by respective second transitions 22. All the above-mentioned parts are arranged on or in a housing 28 of the loop probe.

In accordance with the invention, the coupling structure 10 takes the form of an RF waveguide having at least one signal conductor or guide 24 and at least one reference conductor or guide 26.

The coupling structure 10, the first transitions 20, the first signal conductors or guides 12, the second transitions 22 and the outputs 14 all have impedances which are matched to one another, thus enabling high directional attenuation to be achieved. The contactless loop probe according to the invention is thus impedance-controlled.

Shown in FIGS. 4 and 5 are two illustrative embodiments of coupling structure in the form of a planar line. The planar line comprises a centre conductor 24 and an outer conductor 26, which end at the first port 16 and second port 18 respectively.

FIGS. 6 to 8 show an alternative embodiment for the coupling structure 10. In this case the latter takes the form of a co-axial conductor having a center conductor 30 and an outer conductor 32. Formed in the outer conductor is a rectangular opening 34 to serve as a coupling slot, the inner conductor 30 thus being exposed in the region of the opening 34. FIGS. 9 to 11 show various embodiments for the opening 34, which may be rectangular (FIG. 9) or oval (FIG. 10) in form or which may even comprise a plurality of individual openings, as is shown in FIG. 11 which takes a plurality of circular openings 34 as an example.

FIGS. 12 to 14 show various embodiments of coupling structure 10, in the form of a co-axial line having an opening 34 in the outer conductor 32, which latter is arranged close to a signal line 36 to couple out a signal travelling along the signal line 36.

The contactless loop probe is used for applications in a contactless measuring system, such as for contactless vector network analysis for example. For this purpose, the loop probe is positioned in the electromagnetic near field of an electrical signal line 36 (FIGS. 12 to 14). Together with the signal line 36 it forms a coupler. Part of the electromagnetic field of the signal line 36 is coupled out by the loop probe and conveyed to the output ports 16, 18 of the loop probe. The contactless loop probe according to the invention is impedance-controlled. Impedance-controlled loop probes have certain advantages over non-impedance-controlled probes. Amongst other things, it is possible to achieve high directional attenuation, and fewer sheath waves are produced, the probes can be more satisfactorily defined for analytical purposes and the cut-off frequency is higher than in the case of non-impedance-controlled measuring probes. What impedance-controlled means is that the measuring probes are optimized for low reflection and high directional attenuation, i.e., an impedance-controlled loop probe has a low insertion loss. The impedance-controlled coupling structure 10 may be of virtually any desired shape.

The co-axial contactless loop probe which is shown in FIGS. 6 to 14 takes the form of a screened, impedance-controlled, co-axial near-field measuring probe. This probe comprises the co-axial line 30, 32 which has a defined coupling slot 34 or defined coupling holes 34. Examples of different coupling geometries are shown in FIGS. 9 to 11. The co-axial contactless loop probe serves for use as a coupler in the near field of the RF or microwave line 36. Seen in combination with the center conductor 30 of the co-axial line, the coupling opening 34 or coupling openings 34 are sized in such a way that the co-axial contactless loop probe (measuring probe) has high power transmission with a low reflection factor between first port 16 and second port 18, i.e., the geometry of the center conductor 30 may be modified in the region of the coupling opening(s) 34 in comparison with its geometry in the rest of the co-axial line. The entire measuring probe has inductive and capacitive coupling properties and acts as a loop coupler.

In conventional, non-impedance-controlled loop couplers, the coupling structure comprises one or two co-axial conductors having continuous or connected center conductors. To enable coupling to take place to a second line, the outer screen (outer conductor) of the co-axial line is completely removed. This results in a wave discontinuity in the line and hence in reflections. In the case of the loop coupler shown in FIGS. 6 to 8, only a window 34 is removed from or cut out of the co-axial screen 32, and only low reflections are thus produced if a wave is fed to the first port 16 or the second port 18. These reflections can be minimized to a further degree by changing the geometry of the center conductor. Various embodiments are shown in FIGS. 12 to 14. As an option, the co-axial line may be surrounded by an absorbent housing in the case of the impedance-controlled loop probe.

In the case of the impedance-controlled loop probe shown in FIGS. 1 to 3, the coupling structure 10 takes the form of a planar, impedance-controlled, two-wire loop having an impedance-controlled transition to two planar co-planar lines which are connected in turn, by an impedance-controlled transition, to two co-axial lines 12. The shape of the two-wire loop 10 may be as desired. Examples of two different shapes are shown in FIGS. 4 and 5.

The coupling structure is so designed that the coupling-out of an electromagnetic wave from a waveguide 36 (the input line to a DUT) is possible. The coupling structure 10 has at least two further waveguides 12 which are coupled to the said coupling structure 10. The waveguides 12 connected to the coupling structure 10 are generally equipped with a wave transition 14 to connect the probe to a measuring system or to complex terminating impedances. The probe which is shown by way of example thus comprises at least one coupling structure 10 having at least two waveguides 12 and transitions 14, all the components being designed together to be impedance-controlled. Impedance-controlled means that if power is fed into any desired waveguide of the coupling structure 10, only very little power is reflected and high directional attenuation is obtained if all the other wave guides are terminated by controlled impedances.

Rather than being connected to two waveguides 12, the coupling structure 10 may also have impedance-controlled connections to a plurality of waveguides 12, i.e., the loop probe may have more than two outputs 14.

In a preferred embodiment, the measuring probe has only one output 14, the coupling structure 10 or rather one of the ports 16, 18 having an impedance-controlled termination within the housing 28 of the measuring probe.

The loop probe may also have more than one impedance-controlled coupling structure 10. The individual coupling structures 10 are then connected together by an impedance-controlled waveguide or a second signal conductor or guide.

More than one loop probe may be accommodated in a common housing 28 and for example, if the coupling structures 10 are coupled electromagnetically to a further waveguide 36 on a measuring substrate, a contactless impedance-controlled twin directional coupler is produced.

The measuring probes may include a device (a sensor) for checking distance. Various sensors are conceivable: optical, electrical, mechanical, electromechanical, and the like. The distance information may be passed to the measuring system electrically, mechanically, optically or acoustically.

As an option, the impedance-controlled contactless loop probe may include in addition sensors with which it is possible to ensure exact three-dimensional positioning in space. These sensors comprise for example a miniature camera for detecting positioning marks by pattern recognition processes. Automated positioning of the probe is possible by means of the probes.

To suppress sheath waves, the outer housing is sheathed with amongst other things ferrite and/or absorbent materials.

The impedance-controlled contactless loop probe may be of any desired shape and may comprise various waveguides such for example as hollow waveguides, co-axial conductors, planar lines.

The coupling geometry is optimized for low reflection (impedance-controlled) and for high directional attenuation when a loop probe is coupled to another waveguide such for example as hollow waveguides, co-axial guides or planar lines.

The geometry of the housing 28 may be of any desired form.

When the coupling structure takes a planar form, the individual planar lines are electrically connected by, for example, (bond) wires.

The field in which the impedance-controlled loop probe is preferably used is metrology and EMC technology, and for the production of directional couplers.

As shown in FIGS. 1 and 2, the housing 28 of the measuring probe may have a mounting for fastening the measuring probe to/into a measuring system.

The first transition 20 between the coupling structure 10 and the waveguides 12 may be of any desired type, in which case it is always impedance-controlled. The transition is for example soldered, brazed, welded or adhesive-bonded.

To improve the dynamic measurement characteristics, the coupled-out signals are amplified by a measurement amplifier. For this purpose, an amplifier is implemented in the impedance-controlled loop probe, such for example as in the individual waveguides 12 connected to the coupling structure 10. This amplifier too is impedance-controlled, i.e., its impedance is matched to the input impedance of the probe and there are thus low input reflections and high directional attenuation. The probe is then an active measuring probe.

In a preferred refinement of the invention, the contactless loop probe is combined with a positioning arrangement and the probe can thus be displaced in all dimensions or in only one or two, etc. The positioning arrangement may be incorporated in a probe holder or in the housing 28 or may be connected to the loop probe or the housing 28 by a mounting. The positioning arrangement may be capable of being operated manually and/or may be motorized. Hence it may be active or passive. The distance between the probe and the measurement substrate for example may be set or adjusted with the positioning arrangement. The positioning arrangement may include a control line for control purposes.

While the present invention has been particularly described, in conjunction with the specific preferred embodiment(s), it is evident that many alternatives, modifications, and variations will be apparent to those skilled in the art, in light of the foregoing description. It is therefore contemplated that the appended claims will embrace any such alternatives, modifications, and variations as falling within the true scope and spirit of the present invention.

Thus, having described the invention, what is claimed is:

1. A contactless loop probe for contactless coupling-out of an RF signal for a contactless measuring system, comprising at least one coupling structure and a first signal conductor which is electrically connected to the coupling structure by a first transition and which is electrically connected by a second transition to an output for electrical connection to the measuring system, the coupling structure forming an RF waveguide having a signal conductor and a reference conductor, wherein said signal conductor forms a center conductor and said reference conductor forms a coaxial outer shield for said center conductor, and a coupling slot formed in said outer conductor, said coupling slot extending only partially around said outer shield, said signal conductor being exposed in a region said slot.

2. The contactless loop probe of claim 1 wherein said slot comprises a rectangular or oval in form or a plurality of individual openings, such as circular openings.

3. The contactless loop probe of claim 1 including having impedances of the coupling structure, the first transition, the first signal conductor, and the second transition controlled such that impedances are matched to one another resulting in a high input return loss and a high directional effect.

4. The contactless loop probe of claim 1 including the signal conductor forming an RF signal line, an RF signal line for a co-axial line, a planar strip line, a coplanar line, or a hollow waveguide.

5. The contactless loop probe of claim 1 including having either the first or second transition, or both, forming a planar transition, a co-axial transition, a coplanar transition, a hollow waveguide transition, a planar-co-axial transition, a planar-hollow waveguide transition, a co-axial-hollow waveguide transition, a coplanar-co-axial transition, a coplanar-hollow waveguide transition, or a planar-coplanar transition.

6. The contactless loop probe of claim 1, wherein the coupling structure includes two ends, one end being electrically connected to the first signal conductor or guide and the other end being electrically connected to a terminating resistor or impedance.

7. The contactless loop probe of claim 1, wherein the coupling structure includes two ends, each end being electrically connected to a first signal guide.

8. The contactless loop probe of claim 1 including at least one output forming an RF signal line, an RF signal line for a co-axial line, a planar strip line, a coplanar line, or a hollow waveguide.

9. The contactless loop probe of claim 1 including two or more coupling structures, every two coupling structures being electrically connected together by a second signal line and respective first transitions.

10. The contactless loop probe of claim 9 including at least one second signal line forming an RF signal line, an RF signal line of a co-axial line, a planar strip line, a coplanar line, or a hollow waveguide.

11. The contactless loop probe of claim 1 including a device for determining the distance at which the coupling structure is situated from a conductor or guide emitting a near field.

12. The contactless loop probe of claim 11 wherein the device for determining the distance comprises an optical, electrical, mechanical, or electromechanical distance sensor, or any combination thereof.

13. The contactless loop probe of claim 1 including a device for determining the position of the loop probe in space.

14. The contactless loop probe of claim 13, wherein the device for determining the position of the loop probe in space includes an image sensor.

* * * * *